United States Patent [19]
O'Brien

[11] Patent Number: 6,107,876
[45] Date of Patent: Aug. 22, 2000

[54] DIGITAL INPUT SWITCHING AUDIO POWER AMPLIFIER

[75] Inventor: Thomas Joseph O'Brien, Limerick, Pa.

[73] Assignee: Ravisent Technologies, Inc., Malvern, Pa.

[21] Appl. No.: 09/291,168

[22] Filed: Apr. 13, 1999

[51] Int. Cl.[7] .................................................. H03F 3/38
[52] U.S. Cl. .............................. 330/10; 381/111; 332/109
[58] Field of Search .............................. 330/10; 332/109, 332/110; 381/104, 111, 116, 117

[56] References Cited

U.S. PATENT DOCUMENTS

| | | | |
|---|---|---|---|
| 5,559,467 | 9/1996 | Smedley | 330/10 |
| 5,617,058 | 4/1997 | Adrian et al. | 330/10 |
| 5,978,421 | 11/1999 | Shoji | 375/297 |

OTHER PUBLICATIONS

MPEG–2: The basics of how it works, Unknown No month, No year.

*Primary Examiner*—Robert Pascal
*Assistant Examiner*—Henry Choe
*Attorney, Agent, or Firm*—Michael A. Glenn

[57] ABSTRACT

A digital input switching audio power amplifier uses a simple logic circuit and/or software program for signal processing and, therefore, does not require an expensive DSP processor. The invention provides an approach that allows the integration of power level meters and volume controls in the logic circuit. In one embodiment of the invention, the amplifier accepts multiple inputs, an active one of which may be digitally selected. The invention uses this novel approach to signal processing to achieve high performance. The invention also provides lower system cost as a result of the higher levels of system integration provided by the logic circuit. Increased system versatility results from a modular design which allows the production of an amplifier having optimum cost-to-performance ratios. The amplifier is implemented in ASIC and FPGA circuitry, such that a designer using the invention is provided with flexibility in choosing the various operating parameters of the amplifier, e.g. the amplifier is capable of operating at various power levels and of implementing various output stage topologies.

23 Claims, 3 Drawing Sheets

DIGITAL INPUT SWITCHING AUDIO POWER AMPLIFIER

BACKGROUND OF THE INVENTION

1. Technical Field

The invention relates to audio amplification. More particularly, the invention relates to a digital input switching audio power amplifier.

2. Description of the Prior Art

The current trend for audio information processing is to place most audio sources in the digital domain, rather than in the analog domain. That is, audio information is now usually stored in a digital format, instead of in an analog format.

Existing amplifier technology typically concentrates on efficiency. Such modern technology evolved from the primitive Class D amplifiers of the 1970s. Parallel developments in device technology have resulted in faster semiconductors and better topologies that allow the manufacture of lower distortion Class D, or "switching" audio amplifiers. However, these amplifiers have typically had an analog input only, and must incorporate feedback to compensate for distortion due to timing errors. Accordingly, digital input streams must first be converted to analog signal and then amplified with an analog Class D amplifier to create an efficient digital input amplifier.

One approach to processing a digital signal pursuant to audio amplification uses an external digital-to-analog converter (DAC) for input conversion (the post-DAC portion of such a system is manufactured by Linfinity Microelectronics, Inc. 11861 Western Avenue, Garden Grove, Calif. 92841). Such audio amplification systems require analog feedback to have reasonable performance characteristics. The mixed-signal nature of this topology is inherently expensive to produce.

Another approach to processing a digital signal pursuant to audio amplification uses a digital signal processor (DSP) and a field programmable gate array (FPGA) configured as a power DAC capable of driving a loudspeaker (such system is manufactured by Apogee Technology, Inc. 129 Morgan Drive, Norwood, Mass. 02062). This approach is complex and expensive due to the large signal processing requirement and lower integration level.

It would be advantageous to provide a low cost, high efficiency, low distortion audio amplifier for digital audio sources.

SUMMARY OF THE INVENTION

The invention provides a digital input switching audio power amplifier which uses a simple logic circuit or software program for signal processing and which, therefore, does not require an expensive DSP processor. The processing algorithms can be (if desired) performed in a DSP or "host processor" as well.

The invention provides an approach that allows the integration of power level meters. The meters display the average power output level by calculating it in the digital domain and displaying the information as a bar graph display (typically with LEDs).

A volume control can also be included in the logic circuit. In one embodiment of the invention, the amplifier accepts multiple inputs, an active one of which may be digitally selected. The specifications of the digital audio input may be displayed to the user, such as sample rate, number of active data bits, and data validity.

The primary advantage of handling the signal processing requirement in a logic circuit is that the amplifier system control and output control can be integrated in the same IC. This provides for an integrated amplifier system capable of multiple audio channel processing and control contained in a low cost ASIC. Flexibility in the power output capability can be altered without affecting the processing. Higher levels of integration would be achieved by containing multiple channels of power sections in a single IC or performing some (or all) of the signal processing algorithms in a processor.

The invention provides a topology that receives a digital audio signal as an input and that performs all of the signal conditioning in the digital domain to produce a signal that drives the final stage of the amplifier, which must be analog (since power-digital is really analog circuitry). The input is provided by a digital audio source, which can be in any one or more of several different formats. The most typical format commonly is the $I^2S$ format, which is a standard that is used by most modern digital-to-analog converters (see www.burr-brown.com or www.cirrus.com for more information on $I^2S$).

The invention comprises a system that may be thought of as a power switching, digital-to-analog converter. A serial digital signal is received by the system by a serial interface which creates a parallel data stream. The parallel signal is provided to an optional volume control element that scales the data. The output of the volume control drives an oversampling and/or an interpolation filter, which increases the sample rate. Oversampling (typically FIR filter) is more complicated and more expensive than interpolation (linear type) and the invention provides for various embodiments of the system that may or may not include oversampling and interpolation, depending on the level of performance vs. cost desired. Because oversampling is a more "expensive" process, it is often followed by an interpolator, which increases the data rate further.

After processing by the oversampling filter, the signal is provided to a linearizer (if used, also for performance enhancement). The signal is linearized to correct the timing error inherently introduced by PWM. The signal then goes to a noise shaper. The noise shaper compensates for distortion created by the limited resolution of the PWM output value. The resolution of the PWM output value is limited by the clock speed of the logic. Typically, the system has a clock frequency of 45 MHz, which provides 128 cycles per oversampled data. Thus, the resolution of the output is only 7 bits, which is unacceptable for digital audio. The noise shaper algorithm adds a moving offset to the output data so that the average output value is much closer to 16 bit resolution (or more), taking advantage of the fact that the output sampling rate is much higher than the input sample rate. Thus, the noise shaper allows for lower noise in the audio range and higher noise above the audio range.

At this point, the noise shaper output value is used to create pulse width modulation. The pulse width modulator (PWM) compares this signal with either a ramp signal or a triangle waveform, either of which is digitally synthesized. The pulse width of the output can be limited to be within an acceptable percentage of zero and within an acceptable percentage of 100% at minimum or maximum, respectively. This ensures that the output section can resolve the output value. Accordingly, it is necessary to provide a limiter function. The limiter function can be applied before the noise shaper, after the noise shaper, or after the PWM.

At the output of the PWM, the signal is a one bit signal that is clocked at a high rate, e.g. a 45 MHz signal or a 90

MHz signal. The PWM drives a delay timing control block which adds a delay to prevent shoot-through on the output stage if necessary. The output stage may take any known form and, in the preferred embodiment of the invention, is an H bridge having totem pole outputs. The output stage could also be, for example, a half bridge circuit. Further, the modulation does not necessarily have to be applied only to one side of the bridge. For example, the modulation may b e performed differentially on two sides of the bridge, or it could be performed in quadrature to improve performance.

The invention uses this novel approach to signal processing to achieve high performance. The invention also provides lower system cost as a result of the higher levels of system integration provided by the logic circuit. Increased system versatility results from a modular design which allows the production of an amplifier having optimum cost-to-performance ratios. The placement of the signal processing algorithms is also flexible allowing lower hardware complexity levels where a digital processing unit is available. A designer using the invention is provided with flexibility in choosing the various operating parameters of the amplifier, e.g. the amplifier is capable of operating at various performance levels, at various power levels, and with various output stage topologies.

DETAILED DESCRIPTION OF THE INVENTION

The invention provides a digital input switching audio power amplifier which uses a simple logic circuit and/or software program for signal processing and which, therefore, does not require an expensive DSP processor. The invention provides an approach that allows the integration of power level meters and volume controls in the logic circuit. In one embodiment of the invention, the amplifier accepts multiple inputs, an active one of which may be digitally selected.

The invention uses this novel approach to signal processing to achieve high performance. The invention also provides lower system cost as a result of the higher levels of system integration provided by the logic circuit. The use of a processor can provide additional savings on logic complexity. Parsing of the system can occur anywhere in the signal chain. Increased system versatility results from a modular design which allows the production of an amplifier having optimum cost-to-performance ratios. All or part of amplifier is implemented in ASIC and/or FPGA circuitry, such that a designer using the invention is provided with flexibility in choosing the various operating parameters of the amplifier, e.g. the amplifier is capable of operating at various power levels and of implementing various output stage topologies.

Figure 1:
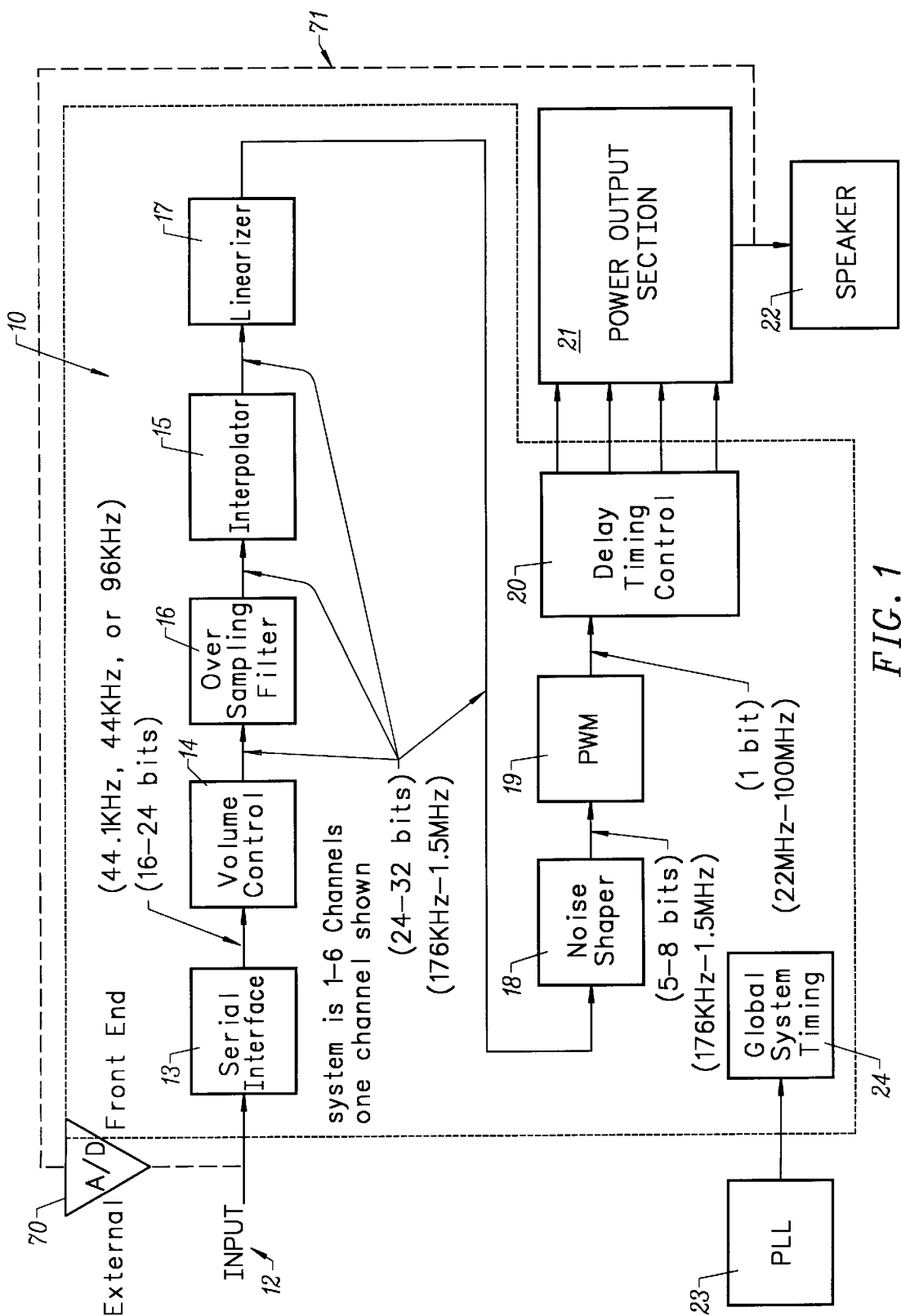
FIG. 1 is a block schematic diagram of a direct digital amplifier front end according to the invention.

FIG. 1 is a block schematic diagram of a direct digital amplifier front end according to the invention. The front end 10 receives a serial digital audio stream at an input terminal 12. In the presently preferred embodiment of the invention, the serial digital audio stream is a 1 bit digital signal. It will be appreciated by those skilled in the art that a variety of digital audio interface standards may be used as the input signal.

The input signal is communicated to a serial interface circuit 13 that converts the serial data to parallel data at the input sampling rate. The serial data can be provided via any number of input channels. The preferred embodiment of the invention consists of six input channels, of which only one channel is shown on FIG. 1. Channel selection is accomplished through the use of any known mechanical scheme, e.g. a rotary switch, or digital selection scheme, e.g. an n-to-one multiplexer. The serial interface is not required in those embodiments of the invention that provide a parallel digital audio signal.

The circuit output data width is determined by the input data rate. In the presently preferred embodiment of the invention, a data rate of 44.1 kHz, 44 kHz, or 96 kHz may be provided. The output of the serial interface is a parallel digital audio data signal that is between 16 and 24 bits wide. Those skilled in the art will appreciate that the data rate and data signal width are a matter of choice as is appropriate for the application to which the invention is put.

The volume control 14 receives the signal output from the serial interface and scales the data output from the serial interface. In the presently preferred embodiment of the invention, the output of the volume control is a digital signal that is from 24 to 32 bits wide and that has a data rate of 176 kHz to 1.5 MHz. The volume level may also be adjusted by an external control, such as a microprocessor controlled circuit, or it may be adjusted by a switch, e.g. pushbutton switches that adjust the volume up and down. Further, various signals processing functions, such as tone and equalization, could be implemented at this point. Additionally, the volume control function can readily be implemented in software, if desired.

The volume control receives a signal in the digital domain. Typically, the data is provided as a twos-complement number, for example a 16-bit number that is multiplied by, for example, an 8-bit number to get a scaled value. The volume control in the preferred embodiment of the invention operates by multiplying the signal by a certain number, which is the volume number. The volume is controlled in the presently preferred embodiment of the invention with a pair of push buttons, up and down, which operate a counter that slowly counts up or down, based on whether the volume is to be higher or lower. Volume control operation can also b e performed through an interface to a processor which can write to the front end of the amplifier to tell it where to set the volume. Finally, the volume control could be in the analog domain.

An interpolator 15 may be provided to increase the data rate of the signal provided from the volume control by adding calculated samples in between actual samples. The use of such circuits is known and understood by those skilled in the art. Additionally, the interpolator function can readily be implemented in software, if desired.

The oversampling filter 16, which receives the signal produced by the interpolator, is a low pass filter for smoothing the sample data, increasing the sample rate, or both. A typical oversampling filter is an FIR type having low pass band ripple, steep roll-off characteristics, and a cut-off frequency between 20 kHz and 40 kHz. The sample rate is typically increased to that of the output pulse width modulator rate. Additionally, the oversampling filter function can readily be implemented in software, if desired.

A linearizer 17 receives the signal produced by the oversampling filter and corrects for the errors produced by discrete-time pulse width modulation versus analog type pulse width modulation. A simple linearizer uses linear interpolation to determine where a linear ramp crosses the interpolated signal. The interpolation can be performed on multiple sample cycles with a single pulse width modulation cycle for increased accuracy (see FIG. 2, discussed below). While shown on FIG. 1 in connection with the preferred embodiment of the invention, the linearizer is not required to practice the invention. Additionally, the linearizer function can readily be implemented in software, if desired.

A noise shaper 18 is used to convert the signal from the linearizer (if provided) or the oversampling filter (if no linearizer is included in the circuit) to a lower resolution. The clock rates required for high fidelity audio in pulse width modulators is extremely high. The required clock rate is lowered by limiting the output time resolution. Conversion to a lower resolution by simply truncating the data causes an unacceptable increase in the noise floor. To compensate for this, the noise shaper shifts the data by adding a moving offset to the incoming data. This allows for lower noise in the audio range and higher noise above the audio range. In the preferred embodiment of the invention, the noise shaper consists of one or more error integrators inside a feedback loop. The loop accumulates output errors that result from truncating the data (see FIGS. 3a and 3b, which are discussed below). Additionally, the noise shaper function can readily be implemented in software, if desired.

A pulse width modulator 19 creates a pulse stream that is equivalent in level to the input value. The pulse width modulator uses a high speed clock signal and linear ramp signal. The ramp signal value is compared with the input data to produce the pulse stream. The modulation technique used in the preferred embodiment of the invention is not limited to straight pulse width modulation and includes variations to regular pulse width modulation that are optimized for audio amplification.

A delay timing control circuit 20 may be provided if the pulse width modulator output signal requires timing adjustment before it is used to drive the power output section 21. This adjustment is necessary because of the limitations of practical power switching devices. For example, dead time is often used to avoid cross conduction in the output stage of the amplifier.

The output power section 21 couples the low level signals from the front end eventually to the speaker 22, i.e. the final output, through power switching devices (not shown) that are connected to the system power supply (not shown). The power switching devices drive the speaker through a passive low pass filter (not shown). This filter is used to remove the switching frequency from the pulse width modulator output. In the preferred embodiment of the invention, the power switching devices are power MOSFET drivers that are driven by the front end 10. The accuracy of the power output section is extremely important to the end system performance.

A phase locked loop 23 is used to create a stable, low jitter clock 24 which is synchronized to the incoming data to run the system. The phase locked loop may be incorporated into the front end if desired.

The power output section of the system is driven by a power supply voltage. Varying that power supply voltage also varies the output signal volume.

The preferred embodiment of the invention is an open-loop system in which there is no feedback. In other embodiments of the invention, feedback may be used to improve the system's performance. The feedback path 71 (FIG. 1, in dashed lines) in such case is preferably into an A-to-D converter 70 from where the power output section drives the speaker. The output of the A-to-D converter is this communicated back into the front end.

The operation of the invention may be thought of as converting the digital signal from a very low-frequency, high bit rate signal, i.e. a wide signal, to a very high-frequency, narrow signal to produce a bit value that creates an output from the power amplifier that is recognized in the analog domain. Each output bit is provided at, for example, 45 MHz, such that each digital bit represents a portion of the analog waveform that is to be reproduced by the speaker.

Figure 2:
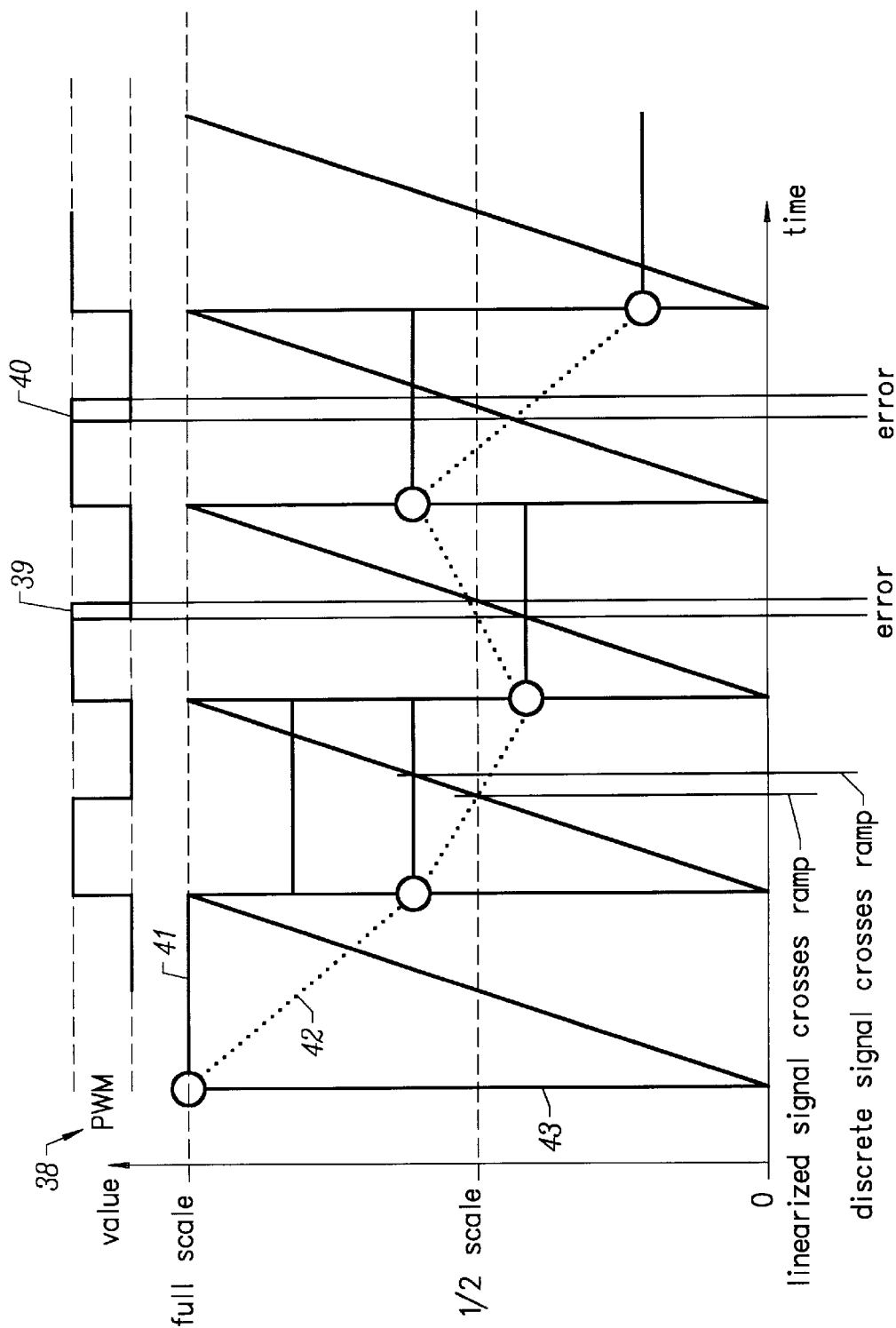
FIG. 2 is a timing diagram showing a pulse width modulation linearizer according to the invention.

FIG. 2 is a timing diagram showing a pulse width modulation linearizer according to the invention. In FIG. 2 a pulse width modulation signal PWM 38 is shown, in which timing errors 39 and 40 are indicated. The pulse width modulation signal is shown mapped to a linear ramp signal 43 in which each cycle of the pulse width modulation signal corresponds to a complete ramp signal cycle. FIG. 2 compares the discrete digital signal 41 with the linearized digital signal 42, relative to the linear ramp 43 and the pulse width modulation signal 38. From FIG. 2 it can be seen that the linearizer is key to smoothing the level steps of the discrete signal. The error mentioned above occurs when the linearized signal crosses the ramp signal before the discrete signal does. In this case, the linearized signal has a more positive (or negative) value than the discrete signal. Because the discrete signal leads or lags the linearized signal in such case, and the discrete signal is based upon the actual input signal, an error occurs. As discussed above, the linearizer uses linear interpolation to determine where the linear ramp signal crosses the interpolated signal.

FIG. 2 shows that the analog equivalent waveform is changing much faster than the discrete sampled waveform. The discreet sampled waveform is shown as the empty circles. If one were to linearly interpolate the samples and find where the ramp crosses the signal, the result would be a natural PW Web signal which is theoretically distortion-free. However, in the discreet sampled waveform, if there is only one sample per ramp, there could be a much different place where the signal crosses the ramp, than the naturally sampled PWM signal. Thus, the crossing point would not necessarily be along the linear portion of the ramp. This creates a distortion in the output (the error that are discussed above). There are several different techniques for determining where the ramp crosses the signal if interpolation is applied. In the preferred embodiment of the invention, instead of calculating where the ramp crosses the signal, the signal is interpolated to a much finer granularity. Instead of having one sample applied to the comparator per cycle, the cycle is divided into several samples to determine more accurately where the ramp crosses the signal. This determination may be made with another oversampling filter or another linear interpolator.

Figure 3B:
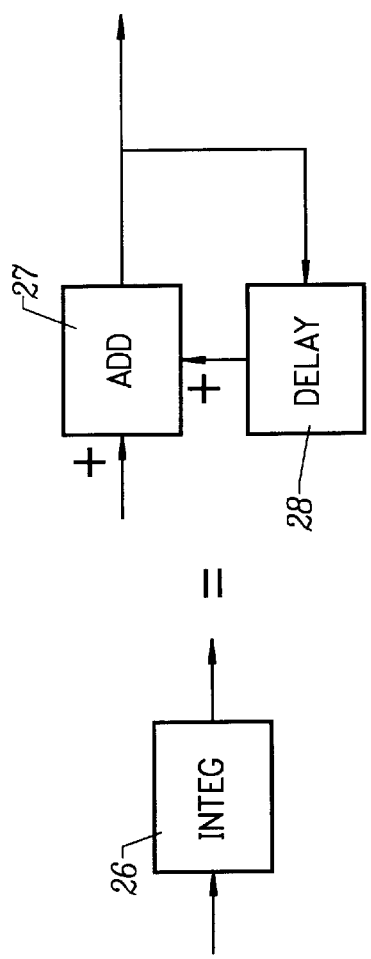
FIG. 3b is a block schematic diagram showing an integrator circuit and an equivalent circuit comprised of an adder and a delay element, according to the invention.
Figure 3A:
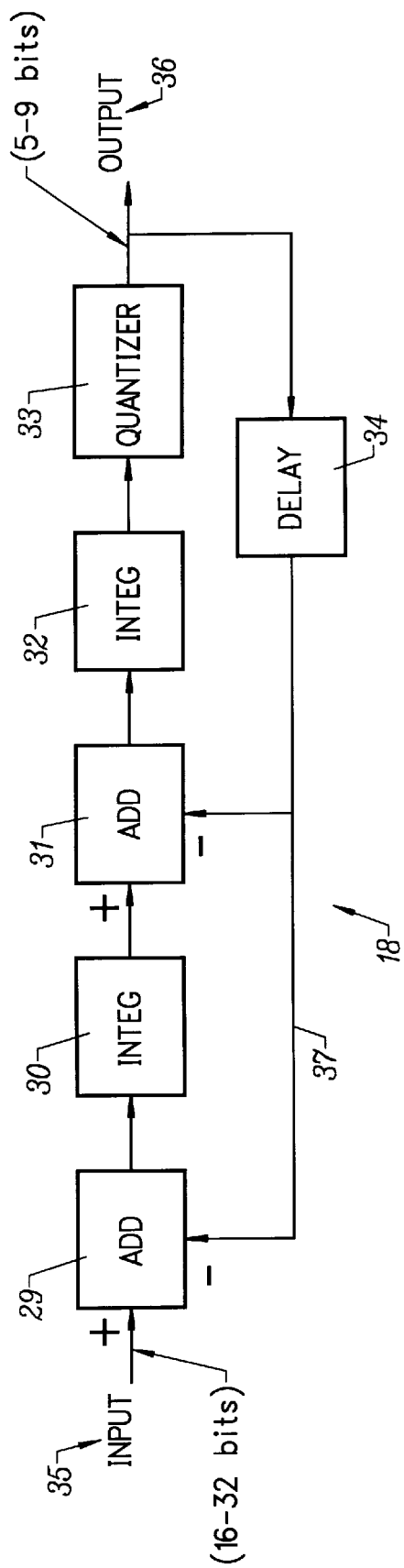
FIG. 3a is a block schematic diagram of a noise shaper (second order example) according to the invention.

FIG. 3a is a block schematic diagram of a noise shaper (second order example) according to the invention. As discussed above, the noise shaper 18 is used to convert the signal to a lower resolution. The noise shaper shifts the data by adding a moving offset to the incoming data to allow for lower noise in the audio range and higher noise above the audio range. In the preferred embodiment of the invention, the noise shaper consists of one or more error integrators 30, 32, inside a feedback loop 37. Depending upon the embodiment of the invention, an input 35 is provided to the noise shaper from either the linearizer 17 or the oversampling filter 16, both of which are discussed above in connection with FIG. 1. The input is provided to an adder 29 and thence to an integrator 30. The adder provides an add function that combines the value of the input signal with that of the output signal 36, as propagated to the adder along the feedback loop 37 via a delay element 344. A second adder 31 and integrator 32 are similarly provided in the noise shaper circuit signal path. The input signal, which is typically 16–32 bits wide, is processed along this path and then presented to a quantizer 33, the output of which is a signal that is typically 5–9 bits wide. The output of the quantizer is routed along the feedback loop, which accumulates the output errors that result from truncating the data.

The noise shaper can be implemented in several different ways. A one stage noise shaper is shown in FIG. 3a. In a single-stage noise shaper, the data come in a first resolution and leave the noise shaper in another resolution. However, to improve resolution and reduce the amount of logic needed to do so, the noise shaper is broken up into several stages, where the resolution is lowered at each stage. The noise shaper herein receives, for example, a 24-bit value and first lowers this value to a 16-bit value, and then lowers that value to an 8-bit value.

Another embodiment of the invention performs noise shaping at different frequencies as well. The reduction to a smaller number of bits is performed at a higher frequency. Thus, the input to the noise shaper is, for example, 24 bits at s 350 kHz. The noise shaper first shapes the signal to 16 bits at 350 kHz and then doubles the number of samples and shapes the 350 kHz signal to 700 kHz at 6 bits.

FIG. 3b is a block schematic diagram showing a generic integrator circuit 26 and an equivalent circuit comprised of an adder 27 and a delay element 28, according to the invention. In one embodiment of the invention, the equivalent adder/delay element circuit may be substituted form an integrator in the noise shaper circuit of FIG. 2a.

Although the invention is described herein with reference to the preferred embodiment, one skilled in the art will readily appreciate that other applications may be substituted for those set forth herein without departing from the spirit and scope of the present invention. For example, the invention may be applied to video signals and other signals in which amplification occurs in a digital/analog domain crossing. Accordingly, the invention should only be limited by the claims included below.

What is claimed is:

1. A digital input switching audio power amplifier, comprising:

a serial interface which creates a parallel data stream from a serial digital signal provided thereto;

a volume control element in communication with said serial interface for scaling said parallel data stream;

an interpolation and/or an oversampling filter in communication with said volume control element for increasing the sample rate;

a linearizer in communication with said interpolation and/or oversampling filer for correcting a pulse width value that is already applied to the signal;

a noise shaper in communication with said linearizer for compensating for distortion by converting a signal received from said linearizer to a lower resolution by adding a moving offset to the incoming data to allow for lower noise in the audio range and higher noise above the audio range;

a pulse width modulator (PWM) in communication with said noise shaper for comparing a signal received from said noise shaper with either a ramp signal or a triangle waveform, either of which is digitally synthesized and limited;

a delay timing control function in communication with said PWM for adding a delay to prevent shoot-through on an output stage; and an output stage in communication with said delay timing control function for driving an output device.

2. The amplifier of claim 1, wherein said output stage is any of an H bridge having totem pole outputs, a half bridge circuit, or a full bridge circuit; and wherein modulation of said output stage is applied to any of one side of a bridge, differentially on two sides of a bridge, or in quadrature.

3. A direct digital amplifier, comprising:

an input terminal for receiving a digital audio stream;

a serial interface circuit in communication with said input terminal for converting a digital audio stream to a parallel data stream at the input sampling rate;

a interpolator in communication with said serial interface circuit for increasing the data rate of the signal provided by said serial interface by adding calculated samples in between actual samples;

an oversampling filter in communication with said interpolator for smoothing sample data, increasing sample rate, or both;

a linearizer in communication with said oversampling filter for receiving the signal produced by said oversampling filter and correcting for errors produced by discrete-time pulse width modulation versus analog type pulse width modulation;

a noise shaper in communication with said linearizer for lowering signal resolution by shifting incoming data provided thereto by adding a moving offset to said data to provide lower noise in the audio range and higher noise above the audio range; and a pulse width modulator in communication with said noise shaper for creating a pulse stream that is equivalent in level to an input value;

wherein said pulse width modulator provides an output that is used to drive an output power element which, in turn, drives a sound reproduction device.

4. The amplifier of claim 3, further comprising:

a delay timing control circuit in communication with said pulse width modulator for timing adjustment to said pulse width modulator output before it is used to drive said power output element.

5. The amplifier of claim 3, further comprising:

an output power element in communication with said pulse width modulator for coupling low level signals output by said pulse width modulator to a sound reproduction device.

6. The amplifier of claim 5, said output power element further comprising:

at least one power switching device that is connected to a system power supply.

7. The amplifier of claim 3, further comprising:

a passive low pass filter for removing a switching frequency from said pulse width modulator output.

8. The amplifier of claim 3, wherein said pulse width modulator uses a high speed clock signal and linear ramp signal; and wherein said ramp signal value is compared with input data to produce a pulse stream.

9. The amplifier of claim 3, wherein said linearizer uses linear interpolation to determine where a linear ramp crosses an interpolated signal.

10. The amplifier of claim 9, wherein linear interpolation is performed on multiple sample cycles with a single pulse width modulation cycle.

11. The amplifier of claim 3, said noise shaper comprising:

one or more error integrators inside a feedback loop which accumulates output errors that result from truncating the data.

12. The amplifier of claim 3, wherein serial data are provided to said input terminal via any number of input channels.

13. The amplifier of claim 11, wherein channel selection is accomplished through the use of any of a mechanical selection scheme or a digital selection scheme.

14. The amplifier of claim 3, wherein output data width is determined by the input data rate.

15. The amplifier of claim 3, further comprising:

a volume control in communication with said serial interface for receiving a signal output from said serial interface and for scaling the data output from said serial interface.

16. The amplifier of claim 15, wherein said volume control receives a signal in the digital domain and scales said signal by multiplying said signal by a selected number.

17. The amplifier of claim 3, further comprising:

a signal processing control in communication with said serial interface for receiving a signal output from said serial interface.

18. The amplifier of claim 3, further comprising:

a phase locked loop for creating a stable, low jitter clock which is synchronized to incoming data.

19. The amplifier of claim 3, further comprising:

a feedback path comprising an A-to-D converter for communicating a feedback signal from a power output section into said input terminal.

20. The amplifier of claim 3, said noise shaper comprising:

a single-stage noise shaper.

21. The amplifier of claim 3, wherein noise shaping is performed at different frequencies.

22. A method for providing a digital input switching audio power amplifier, comprising:

providing a serial interface for creating a parallel data stream from a serial digital signal provided thereto;

providing a volume control element in communication with said serial interface for scaling said parallel data stream;

providing an interpolation and/or an oversampling filter in communication with said volume control element for increasing the sample rate;

providing a linearizer in communication with said interpolation and/or oversampling filer for correcting a pulse width value that is already applied to the signal;

providing a noise shaper in communication with said linearizer for compensating for distortion by converting a signal received from said linearizer to a lower resolution by adding a moving offset to the incoming data to allow for lower noise in the audio range and higher noise above the audio range;

providing a pulse width modulator (PWM) in communication with said noise shaper for comparing a signal received from said noise shaper with either a ramp signal or a triangle waveform, either of which is digitally synthesized and limited;

providing a delay timing control function in communication with said PWM for adding a delay to prevent shoot-through on an output stage; and providing an output stage in communication with said delay timing control function for driving an output device.

23. A direct digital amplification method, comprising:

receiving a digital audio stream at an input terminal;

converting a digital audio stream to a parallel data stream at the input sampling rate with a serial interface circuit in communication with said input terminal;

increasing the data rate of the signal provided by said serial interface by adding calculated samples in between actual samples with an interpolator in communication with said serial interface circuit;

providing an oversampling filter in communication with said interpolator for smoothing sample data, increasing sample rate, or both;

receiving the signal produced by said oversampling filter and correcting for errors produced by discrete-time pulse width modulation versus analog type pulse width modulation with a linearizer in communication with said oversampling filter;

providing a noise shaper in communication with said linearizer for lowering signal resolution by shifting incoming data provided thereto by adding a moving offset to said data to provide lower noise in the audio range and higher noise above the audio range; and creating a pulse stream that is equivalent in level to an input value with a pulse width modulator in communication with said noise shaper;

wherein said pulse width modulator provides an output that is used to drive an output power element which, in turn, drives a sound reproduction device.

* * * * *